(12) United States Patent
Koglin

(10) Patent No.: US 9,385,739 B1
(45) Date of Patent: *Jul. 5, 2016

(54) MATCHED CHARGE EXCHANGE CIRCUIT FOR ANALOG AND DIGITAL CONVERSION

(71) Applicant: Dennis Michael Koglin, Carmel, IN (US)

(72) Inventor: Dennis Michael Koglin, Carmel, IN (US)

(*) Notice: Subject to any disclaimer, the term of this patent is extended or adjusted under 35 U.S.C. 154(b) by 0 days.

This patent is subject to a terminal disclaimer.

(21) Appl. No.: 14/739,508

(22) Filed: Jun. 15, 2015

Related U.S. Application Data

(63) Continuation-in-part of application No. 14/319,819, filed on Jun. 30, 2014, now Pat. No. 9,059,725.

(60) Provisional application No. 61/841,002, filed on Jun. 28, 2013.

(51) Int. Cl.
*H03M 1/12* (2006.01)
*H03M 1/36* (2006.01)

(52) U.S. Cl.
CPC .................................... *H03M 1/36* (2013.01)

(58) Field of Classification Search
CPC ....................................................... H03M 1/12
USPC ........................ 341/172, 155, 159, 122, 158
See application file for complete search history.

(56) References Cited

U.S. PATENT DOCUMENTS

| | | |
|---|---|---|
| 3,462,759 A | 8/1969 | Hoffman |
| 3,626,408 A | 12/1971 | Carbrey |
| 4,471,451 A | 9/1984 | Schenck |
| 5,321,404 A | 6/1994 | Mallinson et al. |
| 7,196,652 B2 | 3/2007 | Liu et al. |
| 7,236,113 B1 * | 6/2007 | Wang .................. G01D 5/24 324/548 |

* cited by examiner

*Primary Examiner* — Peguy Jean Pierre
(74) *Attorney, Agent, or Firm* — Kevin R. Erdman; Brannon Sowers & Cracraft PC

(57) ABSTRACT

The present invention relates to a circuit for converting between an analog input voltage and a corresponding digital representation of the analog input voltage. First, second and third capacitors are used, the first and second capacitors being matched, the third capacitor serving as an accumulator. A first switch is coupled to one end of the first capacitor, and a second switch is coupled between the one end of the first capacitor and one end of the second capacitor. A third switch coupled between the one end of the second capacitor and one end of the third capacitor, with a discharge circuit being coupled between the one end of the third capacitor and an opposite end of the second capacitor. When the third switch is closed the discharge circuit fully discharges the second capacitor onto the third capacitor. The third switch is closed when the analog input voltage is greater than a reference voltage, and wherein the first switch is closed to discharge the first capacitor followed by opening the first switch and closing the second switch to cause charge on the second capacitor to divide equally between the first and second capacitors when the analog input voltage is not greater than the reference voltage. Logic circuitry may also control the conversion according to a clock pulse.

5 Claims, 2 Drawing Sheets

MATCHED CHARGE EXCHANGE CIRCUIT FOR ANALOG AND DIGITAL CONVERSION

CROSS-REFERENCE TO RELATED APPLICATIONS

The present application is a continuation-in-part of U.S. patent application Ser. No. 14/319,819, filed Jun. 30, 2014, now U.S. Pat. No. 9,059,725 issued on Jun. 16, 2015, which claims priority under 35 U.S.C. §119 of U.S. Provisional Application Ser. No. 61/841,002, filed Jun. 28, 2013, the disclosures of which are incorporated by reference herein.

FIELD OF THE INVENTION

The present invention relates generally to circuitry for converting between analog and digital voltages for use in analog-to-digital and/or digital-to-analog circuits, and more specifically to circuitry that utilizes a charge exchange technique for such conversion.

BACKGROUND

Conventional analog-to-digital circuits (ADC) using successive approximation require binary weighted networks of resistors or capacitors. The matching of these components will typically limit the performance of such circuits, such as by limiting the linearity and/or monotonicity of the data converter.

SUMMARY

In one aspect, embodiments of the invention relate to a circuit for converting between an analog input voltage and a corresponding digital representation of the analog input voltage. First, second and third capacitors are incorporated into the circuit, the first and second capacitors being matched. A first switch is coupled to one end of the first capacitor, and a second switch is coupled between the one end of the first capacitor and one end of the second capacitor. A third switch is coupled between the one end of the second capacitor and one end of the third capacitor, with a discharge circuit being coupled between the one end of the third capacitor and an opposite end of the second capacitor. This arrangement results in that when the third switch is closed the discharge circuit fully discharges the second capacitor onto the third capacitor, and the third switch is closed when the analog input voltage is greater than a reference voltage, so that the first switch is closed to discharge the first capacitor followed by opening the first switch and closing the second switch to cause charge on the second capacitor to divide equally between the first and second capacitors when the analog input voltage is not greater than the reference voltage. Thus, the circuitry described herein addresses the prior art problem by developing a charge exchange technique for the conversion. In this circuitry, the binary weighted reference is accomplished by merging two matched capacitors, one with charge and the other empty. The charge on one precisely divides by two when merged with the other, matched capacitor.

Additional embodiments include an integrated control which operates based on a non-overlapping 2-phase clock. The pulses of the clock coordinate the sample & hold, merge & purge, and accumulation portions of the circuitry for the ADC.

One such embodiment involves a circuit for converting between an analog input voltage and a corresponding digital representation of the analog input voltage, the circuit comprising first, second and third capacitors, the first and second capacitors being matched; a first logic circuit coupled to one end of the first capacitor, a first switch coupled between another end of the first capacitor and one end of the second capacitor, a second switch coupled between the one end of the second capacitor and one end of the third capacitor, a discharge circuit coupled between the one end of the third capacitor and an opposite end of the second capacitor, such that when the second switch is closed the discharge circuit fully discharges the second capacitor onto the third capacitor, and a clock having a pulsating 2 phase output, the clock output controlling application of the analog input voltage to the first and second capacitors. The logic circuit is coupled to the clock output to cause charge on the second capacitor to divide equally between the first and second capacitors when the analog input voltage is not greater than the reference voltage.

Another such embodiment involves an analog-to-digital converter for converting an input voltage to a binary representation comprising a reference voltage; a pair of matched capacitors; a comparator circuit coupled to the input voltage and said reference voltage; a clock output coupled to a logic circuit; and code building means for applying the input voltage to the matched capacitors when actuated by the logic circuit and using the comparator to determine a binary value based on the comparator results and for creating a new input voltage.

In one embodiment the code building means includes a discharge means for discharging the charge on one of the matched capacitors to an accumulation capacitor. In another embodiment the comparator circuit includes an opamp circuit for comparing the input voltage to the reference voltage and being coupled to a switch for activating circuitry depending on the output of the opamp.

A further embodiment involves a method using an electronic circuit for converting analog and digital signals. The method of converting between an analog signal and a digital signal comprises the steps of providing a pair of matched capacitors; discharging the matched capacitors; obtaining an input voltage in sync with a clock output; and applying the input voltage to the matched capacitors to divide the input voltage into equal halves. When predetermined conditions are met, one of the matched capacitors is applied to an accumulator to store the value.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawings, wherein.

Figure 1:
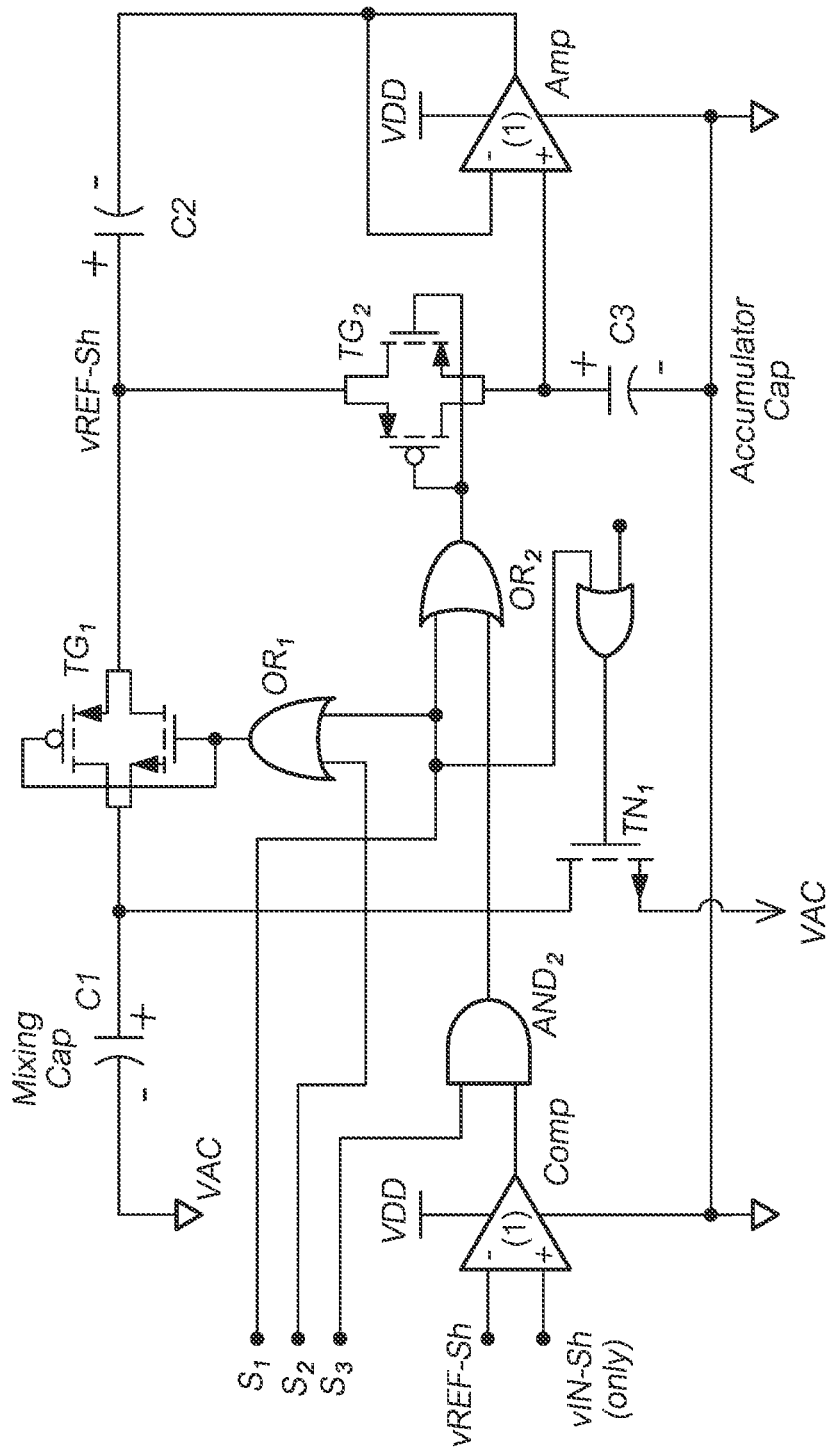
FIG. 1 is a device-level schematic diagram of one embodiment of a charge exchange circuit for converting between analog voltages and digital representations.

Corresponding reference characters indicate corresponding parts throughout the several views. Although the drawings represent embodiments of the present invention, the drawings are not necessarily to scale and certain features may be exaggerated in order to better illustrate and explain the present invention. The circuit diagrams and related depictions are also representative in nature, and actual embodiments of the invention may include further features or steps not shown in the drawings. The exemplification set out herein illustrates embodiments of the invention, in several forms, and such exemplifications are not to be construed as limiting the scope of the invention in any manner.

DESCRIPTION OF THE ILLUSTRATIVE EMBODIMENTS

For the purposes of promoting an understanding of the principles of the invention, reference will now be made to an illustrative embodiment shown in the attached drawings and specific language used to describe operation of such embodiments.

Typical ADC circuits using successive approximation require binary weighted networks of resistors or capacitors. The matching of these components limits the performance such as linearity or monotonicity of the data converter. Embodiments of the present invention address this problem by providing a charge exchange technique and a precision charge pump for the charge summation portion of the conversion. In one illustrative embodiment, the binary weighted reference is accomplished by merging, connecting in parallel, two matched capacitors, one with charge the other empty. The charge thus precisely divides by two when merged with a matched capacitor.

Assuming an eight bit converter the following equation describes the governing math for the converter depicted in FIG. 1 (expectation is 14 bits):

$$Vin\_sh = k1*(1*a7 + a6/2 + a5/4 + a4/8 + a3/16 + a2/32 + a1/64 + a0/128)$$

Variables a0 through a7 are binary. They represent the digital value of vin_sh. They are determined by a successive approximation code building process. The analog-to-digital converter, or adc, compares a known reference voltage, VREF, with an unknown input voltage, Vin. Factors of two portions of the reference voltage are compared with the input voltage. If the reference voltage is contained within the input voltage then it is considered part of the code. The manner in which the binary references are created determines, at least in part, the performance of the adc. In the following description, an illustrative conversion sequence is outlined to show the operation of this illustrative embodiment.

Discharge Capacitors C1, C2 and C3:

The discharge phase begins with signals (s1=1, s2=0, s3=0, s4=0). This forces the voltages of capacitors c1, c2 and c3 equal to zero. When s1 goes high, this closes tn1, tg1 and tg2, and the voltages on the capacitors c1 through c3 are pulled low by tn1.

Charge Capacitors C1 and C2:

The charge phase begins with (s1=0, s2=1, s3=0, s4=0). s2 is high. This opens tn1 and tg2 and closes tg1, thereby connecting each of the "sample and hold" capacitors c1 and c2 to vref_sh for charging.

During the charge phase c1 and c2 are connected in parallel and charged up to vref_sh (vref after sample and hold). And vin_sh is stored on an internal capacitor (not shown). With the charge cycle complete, the binary conversion may begin. In the following description, the illustrative circuit is used a plurality of times to collect a series of binary digits. This series of binary digits is referred to as the CODE, and may be of any length. Conventionally, a CODE is a number of binary digits that is a power of 2, such as an 8-bit byte, a 16-bit word, etc. CODE building circuitry noted below is used to process the input voltage and generate a series of bits, and alternatively may be used to accept a series of input bits to produce an output voltage corresponding to the digital representation.

Code Building:

With (s1=0, s2=0, s3=1, s4=0), tn1 and tg1 are open or closed, and a code check for a7 may be made.

$$vin\_sh > vref\_sh?$$

If this inequality is true, then the most significant bit (MSB), i.e., a7, is part of the code. With s3 high, this condition forces CODE at the output of an1 high which closes tg2 thereby closing the voltage loop around op amp 1. Now, c2 completely discharges into c3 as the op amp inputs force themselves to equal. Note, the voltage in question (voltage across c2) is stacked on top of the accumulator c3. This allows for the functional checking for CODE before committing to the accumulator. With the c2 to c3 charge transfer complete, tg2 is opened and then tg1 is closed. This merges c1 with c2. The charge on c1 will divide equally with c2.

If the above equality is not true, then the MSB is not part of the code, and with s3 this condition forces CODE at the output of an1 low. The switch tn1 is then closed by s4=1 (s1=0, s2=1, s3=0 s4=1), thereby forcing the voltage on c1 low. The switch tn1 is then opened by s4=0, and the voltages on c1 and c2 are merged by closing tg1. The charge on c2 is thus divided equally with c1. The description above applies to the remaining bits of the conversion.

Theoretically this conversion is infinite in bit count, and thus in theory the size of the possible conversion circuit is infinite. However, in known circuitry, this illustrative arrange is limited by noise and resolution factors so that there is a finite limit to the size of the conversion. This approach also makes for a simple digital-to-analog conversion, or dac. Insert a binary word in place of the comp comparator output. The accumulation voltage is thus the desired dac output.

Another illustrative embodiment involves an eight bit converter, also depicted in FIG. 1, in which the following equation describes the governing math for this converter (expectation is 14 bits):

$$Vin\_sh = Bx*(B0 + B1/2 + B2/4 + B3/8 + B4/16 + B5/32 + B6/64 + B7/128) \qquad \text{Eq. 2}$$

Every bit is represented by variables B0 through B7 and a unit function (1 or 0). They represent the digital value of vin_sh (sample and hold). They are determined by a successive approximation code building process. Each bit of equation 1 is a binary weighted portion of the reference voltage. The ADC compares a known reference voltage, charge stored on a capacitor with an unknown input voltage. Factors of two portions of the reference voltage are compared with the input voltage. If the reference portion is contained within the input voltage then it is considered part of the code, that is, a 1 in its MSB position of significance.

How the binary references are created is key to performance of the ADC. During the conversion and starting with the MSB, Bx*B0, is the MSB less than Vin_sh? If yes, B0 is part of the code. It must be saved to be summed during the remaining checks. In one embodiment, a one bit length registers are used to store each result, in another embodiment a register or a memory location is used to store each bit at an appropriate location signifying its significance. The next bit to check is Bx*B1/2. If it plus the saved MSB is less than Vin_sh then the bit in question is yes. Note the reference coefficient for each bit is only available for a short period of time. It is merged with an empty capacitor to divide down for the next bit check.

This process continues until all the bits have been checked and summed if part of the code. The number of bits is determined by the number of bit checks designed into the ADC. Digital circuitry is required to store the code as it is generated, one bit at a time, from MSB to LSB. The maximum number of retrievable bits is set by the number of bits of memory allotted. Assuming no memory restrictions, this divide by two continues until all of bits have been checked. Theoretically, the divide by two stops when only one electron remains. Of course manipulating all the way down to one electron would not be practical. If the ADC output is serial then no additional circuitry is required to change the bit count.

What follows is a description of a circuit that implements the above ADC function.

Discharge Capacitors C1, C2 and C3:

The discharge phase begins with signals (s1=1, s2=0, s3=0, s4=0). This forces voltages of capacitors c1, c2, c3 equal to zero. When s1 goes high capacitors c1 through c3 are pulled low by tn1.

Charge Capacitors C1 and C2:

The charge phase begins with (s1=0, s2=1, s3=0, s4=0). s2 is high. This closes tg1 and connects the sample and hold capacitors c1 and c2 to vref_sh for charging.

During the charge phase c1 and c2 are connected in parallel and charged up to vref_sh (vref after sample and hold). And vin_sh is stored on an internal capacitor (not shown). With the charge cycle complete, the binary conversion may begin:

Code Building:

With (s1=0, s2=0, s3=1, s4=0) a code check for b7 may be made.

vin_sh>vref_sh ?

If yes, then the MSB is part of the code. With tg1 open, switch tg2 closes, the voltage loop around op amp 1 closes. Now, c2 completely discharges into c3 as the op amp inputs force themselves to equal. Note, the voltage in question (voltage across c2) is stacked on top of the accumulator c3. This allows for the functional checking for code before committing to the accumulator. With the c2 to c3 charge transfer complete, tg2 opens then tg1 closes. This merges c1 with c2. The charge on c1 divides equally with c2. The changes in switch positions of transfer gates are accomplished with an external state machine.

If no, then the MSB is not part of the code. Activate pull-down tn1 on c1 (s1=0, s2=1, s3=0 s4=1). Turn off c1 pull-down. Now, merge c1 with c2. The charge on c2 is divided equally with c1. The description above applies to the remaining bits of the conversion.

In the preceeding description, the signals (s1, s2, s3, s4) and associated values are assumed and provided as part of a larger circuit (not shown). Such a circuit may be hardwired into an application specific circuit and the logic of such signals determined by the related logic circuitry. Alternately, such signals may be provided by a special microprocessor chip, for example and video processing chip, or by a general purpose microprocessor. Additionally, a combination of hard-wired logic circuitry and microprocessor circuitry may be used.

This approach also makes for a simple dac. Insert a binary word in place of the comp comparator output. The accumulation voltage is the desired dac output.

Figure 2:
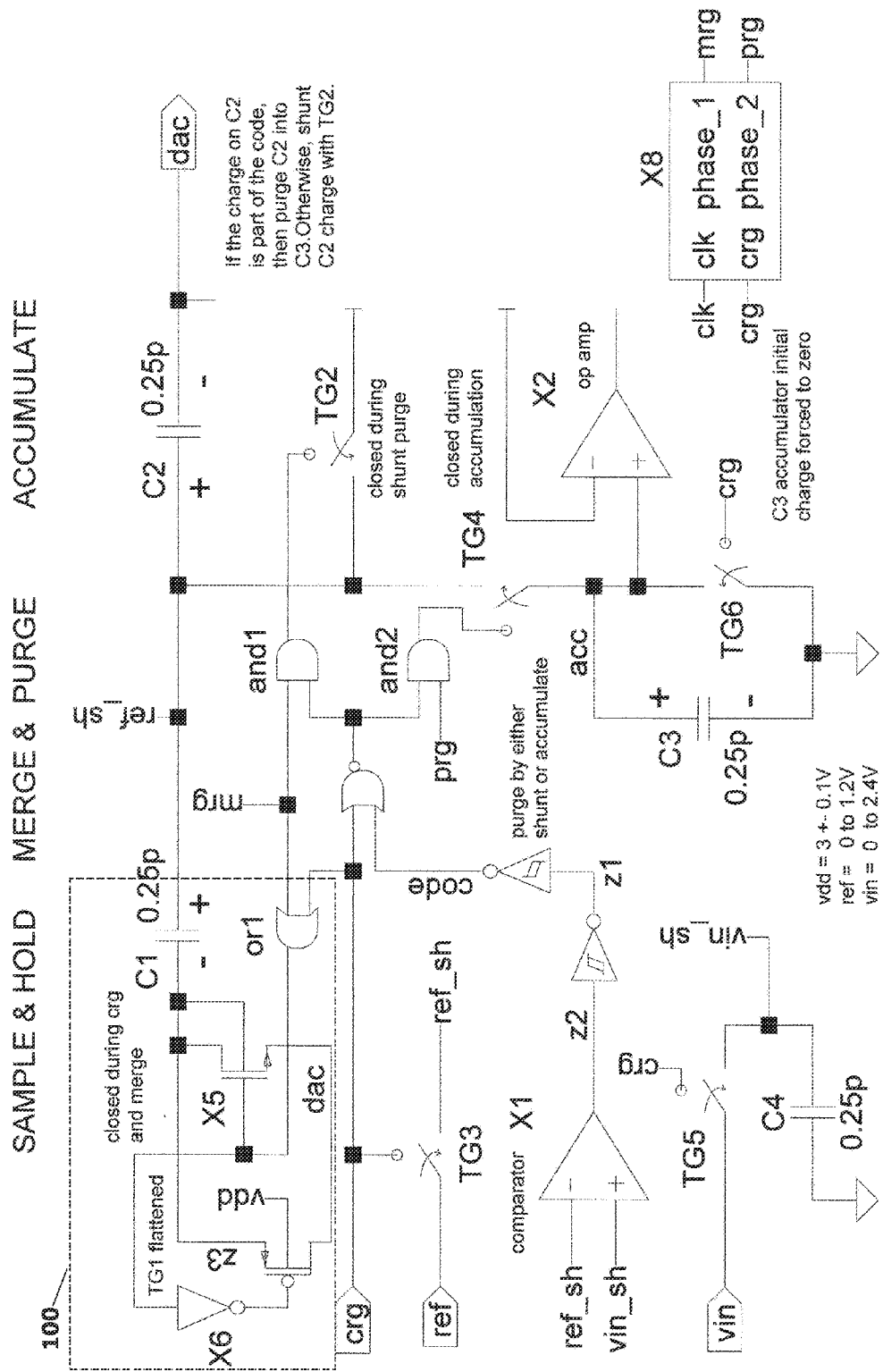
FIG. 2 is a device-level schematic diagram of a second embodiment of a charge exchange circuit for converting between analog voltages and digital representations.

Another embodiment is shown in FIG. 2, which uses similar mathematical relationships to those of the embodiment of FIG. 1. However, in FIG. 2, pin crg replaces the lines s1, s2, s3, and s4. In this embodiment, the binary conversion is initiated by setting crg high (where vdd=3V).

With crg high, the two phase clock is stalled with mrg high and prg low. Transmission gate TG6, closes resulting in the complete discharge of C3. The resulting voltage at node acc is now zero. Op amp X2 is in unity gain configuration providing buffering of acc. The result is a virtual ground at dac for the duration of the crg pulse. For proper charging of capacitors C1 and C2, transmission gates TG1 and TG3 will close. Note, the TG1 subcircuit has been flattened to allow for electrical access to the low side bias (z3). With crg high, TG5 closes resulting in the charging of C4 to vin_sh.

Note, during the crg pulse, transmission gates, TG2 and TG4 are open. After a successful crg function, the accumulator (C3) will have no charge on it. While the C1 and C2 capacitors will be charged to ref_sh. Logic section 200 includes X5, X6, z3 and or1 and controls the charging and discharging of C1 and C2, as described below, to determine the value of each MSB as the 2-phase clock is pulsed.

Mrg and prg are outputs of a non-overlapping 2-phase clock. Mrg and prg are stalled when crg goes high. At this point, the MSB can be determined by the logic value of the code pin. The MSB is a one if the code pin of z1 is a one.

An ADC data conversion begins with a pulse to the crg pin. This will charge C1 and C2 to ref_sh and C3 to zero. With the crg pin voltage low, every cycle of the 2 phase clk will advance the building of the data conversion by one bit. Every bit is evaluated the same. While charge on both C1 and C2 are equal, then check code. If code is high then bit in question is part of the code. The charge on C1 is merged into C2. If code is low then bit is not part of the code. The charge in C2 is dissipated prior to next merge or saved by the accumulator.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected.

What is claimed is:

1. A circuit for converting between an analog input voltage and a corresponding digital representation of the analog input voltage, the circuit comprising:
    first, second and third capacitors, the first and second capacitors being matched,
    a first logic circuit coupled to one end of the first capacitor,
    a first switch coupled between another end of the first capacitor and one end of the second capacitor,
    a second switch coupled between the one end of the second capacitor and one end of the third capacitor,
    a discharge circuit coupled between the one end of the third capacitor and an opposite end of the second capacitor, such that when the second switch is closed the discharge circuit fully discharges the second capacitor onto the third capacitor, and
    a clock having a pulsating 2 phase output, the clock output controlling application of the analog input voltage to the first and second capacitors,
    wherein the logic circuit is coupled to the clock output to cause charge on the second capacitor to divide equally between the first and second capacitors when the analog input voltage is not greater than the reference voltage.

2. An analog-to-digital converter for converting an input voltage to a binary representation comprising:
    a reference voltage;
    a pair of matched capacitors;
    a comparator circuit coupled to the input voltage and said reference voltage;
    a clock output coupled to a logic circuit; and
    code building means for applying the input voltage to the matched capacitors when actuated by the logic circuit and using the comparator to determine a binary value based on the comparator results and for creating a new input voltage.

3. The analog-to-digital converter of claim 2 wherein said code building means includes a discharge means for discharging the charge on one of the matched capacitors to an accumulation capacitor.

4. The analog-to-digital converter of claim 2 wherein said comparator circuit includes an opamp circuit for comparing the input voltage to the reference voltage and being coupled to a switch for activating circuitry depending on the output of the opamp.

5. In an electronic circuit for converting analog and digital signals, a method of converting between an analog signal and a digital signal comprising the steps of:
   providing a pair of matched capacitors;
   discharging the matched capacitors;
   obtaining an input voltage in sync with a clock output;
   applying the input voltage to the matched capacitors to divide the input voltage into equal halves;
   when predetermined conditions are met, applying one of the matched capacitors to an accumulator to store the value.

\* \* \* \* \*